United States Patent
Kurokawa et al.

(10) Patent No.: US 10,115,501 B2
(45) Date of Patent: Oct. 30, 2018

(54) SUBSTRATE FOR SUPERCONDUCTING WIRE, METHOD FOR MANUFACTURING THE SAME, AND SUPERCONDUCTING WIRE

(71) Applicants: Toyo Kohan Co., Ltd., Chiyoda-ku, Tokyo (JP); Sumitomo Electric Industries, Ltd., Osaka-shi, Osaka (JP)

(72) Inventors: Teppei Kurokawa, Kudamatsu (JP); Takashi Koshiro, Kudamatsu (JP); Hironao Okayama, Kudamatsu (JP)

(73) Assignees: Toyo Kohan Co., Ltd., Tokyo (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/916,305

(22) PCT Filed: Aug. 6, 2014

(86) PCT No.: PCT/JP2014/070685
§ 371 (c)(1),
(2) Date: Mar. 3, 2016

(87) PCT Pub. No.: WO2015/033727
PCT Pub. Date: Mar. 12, 2015

(65) Prior Publication Data
US 2016/0217890 A1    Jul. 28, 2016

(30) Foreign Application Priority Data
Sep. 4, 2013 (JP) .................................. 2013-183031

(51) Int. Cl.
*H01L 39/24* (2006.01)
*H01B 12/06* (2006.01)
(Continued)

(52) U.S. Cl.
CPC ............. *H01B 12/06* (2013.01); *B23K 31/02* (2013.01); *C22C 9/00* (2013.01); *C22F 1/08* (2013.01);
(Continued)

(58) Field of Classification Search
CPC ............ B23K 31/02; C22C 9/00; H01B 12/06
See application file for complete search history.

(56) References Cited

U.S. PATENT DOCUMENTS 6,428,635 B1 * 8/2002 Fritzemeier ............... C22C 9/06
117/101
2008/0261072 A1  10/2008 Kashima et al.
(Continued)

FOREIGN PATENT DOCUMENTS

JP    3-275504    12/1991
JP    2008-266686    11/2008
(Continued)

OTHER PUBLICATIONS

Machine translation of JP 3-275504 (dated 1991).*
(Continued)

*Primary Examiner* — Paul A Wartalowicz
(74) *Attorney, Agent, or Firm* — McCarter & English, LLP

(57) ABSTRACT

This invention provides a substrate for a superconducting wire used for manufacturing a superconducting wire with excellent superconductivity and a method for manufacturing the same. Such substrate for a superconducting wire has crystal orientation of metals on the outermost layer, such as a c-axis orientation rate of 99% or higher and a $\Delta\varphi$ of 6 degrees or less, and a percentage of an area in which the crystal orientation is deviated by 6 degrees or more from the (001) [100] per unit area is 6% or less.

5 Claims, 3 Drawing Sheets

(51) Int. Cl.
  *C22C 9/00* (2006.01)
  *C22F 1/08* (2006.01)
  *C22F 1/10* (2006.01)
  *B23K 31/02* (2006.01)
  *H01B 13/00* (2006.01)

(52) U.S. Cl.
  CPC ........... *C22F 1/10* (2013.01); *H01B 13/0016* (2013.01); *H01L 39/2454* (2013.01)

(56) References Cited

U.S. PATENT DOCUMENTS

| | | | |
|---|---|---|---|
| 2008/0274896 A1* | 11/2008 | Ji | H01L 39/2454 505/124 |
| 2012/0040840 A1 | 2/2012 | Okayama et al. | |
| 2012/0208703 A1 | 8/2012 | Okayama et al. | |

FOREIGN PATENT DOCUMENTS

| | | |
|---|---|---|
| JP | 2010-118246 | 5/2010 |
| JP | 2013136807 | 7/2013 |
| WO | 2011007527 | 1/2011 |

OTHER PUBLICATIONS

International Search Report dated Nov. 4, 2014 relationg to co-pending International Application No. PCT/JP2014/070585, filed Aug. 6, 2014—3 Pages.
Supplementary European Search Report based on co-pending European Application No. 14842998, dated Mar. 29, 2017, 7 Pages.
Varanasi, Chakrapani, V., et al. "Biaxially Textured Copper and Copper-Iron Alloy Substrates for Use in YBa2Cu3O7-x Coated Conductors", Superconductor Science and Technology, vol. 19, 2006, pp. 85-95.

* cited by examiner

SUBSTRATE FOR SUPERCONDUCTING WIRE, METHOD FOR MANUFACTURING THE SAME, AND SUPERCONDUCTING WIRE

RELATED APPLICATIONS

This application is a national stage application filed under 35 USC 371 of PCT/JP2014/070685, filed Aug. 6, 2014, which claims the benefit of Japanese Patent Application No. 2013-183031, filed Sep. 4, 2013, all of which are incorporated herein, in entirety, by reference.

TECHNICAL FIELD

The present invention relates to a substrate for a superconducting wire and a method for manufacturing the same. The present invention also relates to a superconducting wire that is manufactured using the substrate for a superconducting wire.

BACKGROUND ART

A superconducting wire is manufactured by superposing a metal substrate, an intermediate layer composed of one or more layers of oxides, such as cerium oxide ($CeO_2$), yttria-stabilized zirconia (YSZ), and yttrium oxide ($Y_2O_3$), and a superconducting layer (RE123 film, RE: Y, Gd, Ho, or the like) on top of each other.

Methods known as techniques for manufacturing crystal-oriented superconducting layers are: the ion-beam-assisted deposition method (IBAD method) that involves depositing a textured intermediate layer on a non-textured metal substrate such as hastelloy, so as to allow the superconducting layer to take on the texture; and a method that involves the use of a biaxially textured metal substrate, so as to allow the intermediate layer and the superconducting layer to take on the texture (e.g., a method involving the use of a rolling-assisted biaxially textured substrate (RABiTS)). The latter method is more advantageous than the former in view of factors concerning future production efficiency, such as film deposition rate. In order to improve superconductivity, a metal substrate is required to have a high degree of biaxial crystal orientation. The crystal orientation of a metal substrate is evaluated in terms of, for example, the c-axis orientation rate or the $\Delta\varphi$ value of the outermost layer of the substrate.

A substrate known as such a metal substrate (a substrate for a superconducting wire) is produced by superposing crystal-oriented copper on a stainless substrate and further superposing nickel thereon. For example, Patent Document 1 discloses a clad textured metal substrate for forming an epitaxial thin film comprising a metal layer and a copper layer bonded to at least one surface of the metal layer. The copper layer has a $\{100\}$ <001> cube texture, provided that a $\Delta\varphi$ is 6 degrees or less ($\Delta\varphi \leq 6°$).

Furthermore, Patent Document 2 discloses a method for manufacturing a metal substrate for a superconducting wire, which comprises laminating a non-magnetic metal plate and a metallic foil made of Cu or a Cu alloy, which has been cold-rolled at high reduction, through surface activation bonding, biaxially crystal-orienting the metallic foil by thermal treatment after lamination, and thus providing an Ni or Ni alloy epitaxial growth film on the surface of the metallic foil. Patent Document 2 describes that the metal substrate obtained by such method achieved an improved crystal orientation rate and a $\Delta\varphi$ of the Ni-plated layer of the outermost layer.

Patent Document 3 discloses a method of manufacturing a metal substrate for a superconducting wire comprising steps of removing a material adsorbed onto a surface of the copper foil by applying sputter etching to the surface of the copper foil, removing a material adsorbed onto a surface of a non-magnetic metal plate by applying sputter etching to the surface of the non-magnetic metal plate, bonding the copper foil and the metal plate to each other using pressure rolls at an applied pressure of 300 MPa to 1500 MPa, heating the bonded laminate to a crystal orientation temperature of copper or above, so as to orient crystals of the copper, and forming a protective layer on a copper-side surface of the laminate by coating. Patent Document 3 describes that the metal substrate obtained by such method achieved an improved c-axis crystal orientation rate and a $\Delta\varphi$ of the copper foil and of the Ni-plated layer.

PRIOR ART DOCUMENTS

Patent Documents

Patent Document 1: JP 2008-266686 A
Patent Document 2: JP 20101 18246 A
Patent Document 3: WO 2011/007527

SUMMARY OF THE INVENTION

Objects to be Attained by the Invention

As described above, a conventional substrate for a superconducting wire was manufactured by designating the c-axis orientation rate and the $\Delta\varphi$ value of the outermost layer of a biaxially crystal-oriented metal substrate at particular levels. It is known that the superconductivity of a superconducting wire is improved as the c-axis orientation rate increases or the $\Delta\varphi$ value decreases.

Even when, in the past, a superconducting wire was manufactured with the use of a metal substrate such that the crystal orientation of metals on the outermost layer exhibited a sufficient crystal orientation rate and a sufficient $\Delta\varphi$ value, it was not possible to consistently achieve superconductivity of such superconducting wire.

Accordingly, it is an object of the present invention to provide a substrate for a superconducting wire used for manufacturing a superconducting wire with excellent superconductivity and a method for manufacturing the same.

Means for Attaining the Objects

The present inventors have conducted concentrated studies in order to attain the above object. As a result, they discovered that a superconducting wire with improved superconductivity could be obtained with the use of a substrate comprising an outermost layer that has been regulated to exhibit the crystal orientation of metals, such as for a particular c-axis orientation rate and a particular $\Delta\varphi$ value, and to comprise a given range of an area in which the crystal orientation is deviated by a particular angle or more from the (001) [100]. This has led to the completion of the present invention. Specifically, the present invention is summarized as follows.

(1) A substrate for a superconducting wire, wherein the crystal orientation of metals on the outermost layer exhibits a c-axis orientation rate of 99% or higher and a $\Delta\varphi$ of 6 degrees or less and a percentage of an area in which the crystal orientation is deviated by 6 degrees or more from the (001) [100] per unit area (1 mm$^2$) is 6% or less.
(2) The substrate for a superconducting wire according to (1), wherein the outermost layer is made of copper, nickel, or an alloy thereof.
(3) A method for manufacturing the substrate for a superconducting wire according to (1) or (2),
the method comprising a step of forming, via thermal treatment, a layer exhibiting a c-axis orientation rate of 99% or higher, a Δφ of 6 degrees or less, and a percentage of an area in which the crystal orientation is deviated by 6 degrees or more from the (001) [100] per unit area of 6% or less.
(4) A method for manufacturing a substrate for a superconducting wire comprising:
a step of laminating a non-magnetic metal plate and a high-reduction rolled metal layer through surface activation bonding; and
a step of subjecting the high-reduction rolled metal layer to thermal treatment, so as to achieve a c-axis orientation rate of 99% or higher, a Δφ of 6 degrees or less, and a percentage of an area in which the crystal orientation is deviated by 6 degrees or more from the (001) [100] per unit area of 6% or less.
(5) The method according to (4), wherein the degree of gloss of the high-reduction rolled metal layer is 45 or less before lamination.
(6) A superconducting wire comprising the substrate for a superconducting wire according to (1) or (2), an intermediate layer superposed thereon, and a superconducting layer superposed thereon.

This description includes part or all of the content as disclosed in the description and/or drawings of Japanese Patent Application No. 2013-183031, which is a priority document of the present application.

Effects of the Invention

According to the present invention, a substrate used for manufacturing a superconducting wire with excellent superconductivity can be obtained by regulating the crystal orientation of metals on the outermost layer to exhibit a c-axis orientation rate of 99% or more and a Δφ of 6 degrees or less and a percentage of an area in which the crystal orientation is deviated by 6 degrees or more from the (001) [100] per unit area to 6% or less.

EMBODIMENTS FOR CARRYING OUT THE INVENTION

Figure 1:
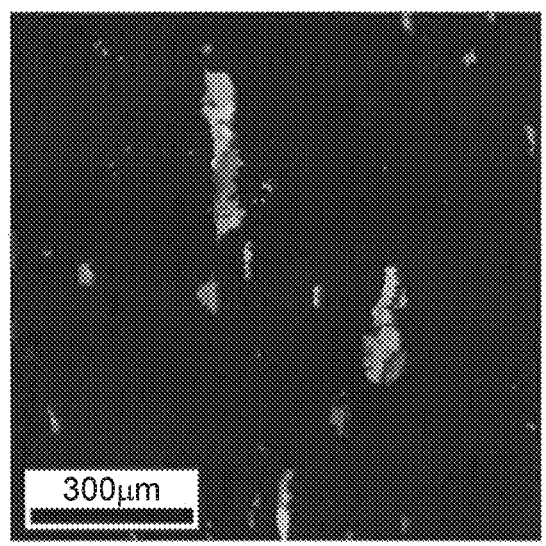
FIG. 1 shows the results of EBSD analysis for the substrate of Example 2.

Hereafter, the present invention is described in detail.
1. Substrate for Superconducting Wire
The substrate for a superconducting wire according to the present invention is characterized by the features described below. That is, such substrate exhibits a crystal orientation of metals on the outermost layer, such as a c-axis orientation rate of 99% or higher and an in-plane orientation degree (Δφ) of 6 degrees or less. In addition, a percentage of an area in which the crystal orientation is deviated by 6 degrees or more from the (001) [100] per unit area (1 mm$^2$) is 6% or less. The symbol "Δφ" represents the in-plane orientation degree. Since a Δφ value is an average and the degree of deviation of each crystal grain is not apparent, such value does not serve as an indicator of a percentage of an area in which the crystal orientation is deviated by a particular angle or more from the (001) [100].

In the present invention, the expression "a percentage of an area in which the crystal orientation is deviated by a particular angle or more from the (001) [100]" refers to a percentage of a crystal area in which the angular difference from the (001) [100] is the particular angle or more when observed via the EBSD method. The term "EBSD (electron back scatter diffraction) method" refers to a technique of analyzing the crystal orientation by means of reflected electron diffraction of Kikuchi lines (i.e., the Kikuchi pattern) generated when an electron beam is applied to the sample under a scanning electron microscope (SEM). In general, an electron beam is applied to the surface of the outermost layer, and the information obtained upon electron beam application is directional information for up to a depth of several tens of nanometers, to which the electron beam penetrates; that is, the directional information of the outermost layer.

The substrate for a superconducting wire according to the present invention is characterized by the outermost layer, which exhibits a percentage of an area in which the crystal orientation of metals is deviated by 6 degrees or more from the (001) [100] per unit area of 6% or less. By regulating the crystal orientation of metals of the outermost layer of the substrate to such level, the superconductivity of a superconducting wire obtained with the use of such substrate can be improved.

On the substrate for a superconducting wire according to the present invention, preferably, a percentage of an area in which the crystal orientation of metals is deviated by 10 degrees or more from the (001) [100] per unit area is less than 1%, and a percentage of an area in which the crystal orientation is deviated by 15 degrees or more per unit area is less than 0.3%, on the outermost layer. Thus, the resulting superconducting wire can achieve excellent superconductivity.

The outermost layer of the substrate for a superconducting wire according to the present invention is preferably made of a metal of a face-centered cubic lattice structure. For example, the outermost layer is composed of one or more members selected from the group consisting of nickel, copper, silver, aluminum, and palladium, or an alloy thereof. Because of ease of achieving a higher degree of biaxial crystal orientation and satisfactory lattice matching with the intermediate layer, the outermost layer is preferably made of copper, nickel, or an alloy thereof.

Concerning the substrate for a superconducting wire according to the present invention, it is sufficient for the outermost layer to have the crystal orientation of metals and crystal orientation described above. In addition, another non-oriented metal layer may be present as the underlying layer thereof.

The thickness of the substrate for a superconducting wire according to the present invention is not particularly limited, and it is preferably from 50 μm to 200 μm. When the thickness of the substrate is less than 50 μm, the substrate cannot retain its mechanical strength. When the thickness is more than 200 μm, in contrast, the substrate cannot retain the processability required for the processing of a superconducting wire.

According to an embodiment of the present invention, the substrate for a superconducting wire according to the present invention comprises a non-magnetic metal plate and a crystal-oriented, high-reduction rolled metal layer superposed on the non-magnetic metal plate. (Hereafter, it is occasionally referred to as a "crystal-oriented metal layer." The biaxially crystal-oriented layer resulting from thermal treatment of the high-reduction rolled metal layer is referred to as a "crystal-oriented metal layer.") A high-reduction rolled metal layer may be provided on one surface of the non-magnetic metal plate, or two high-reduction rolled metal layers may be provided on both surfaces of the metal plate.

The term "non-magnetic" used herein refers to a state in which the relevant metal plate is not ferromagnetic at 77 K or higher; that is, a Curie point or a Neel point thereof exists at 77 K or below and the same is paramagnetic or antiferromagnetic at 77 K or higher. As such a non-magnetic metal plate, a nickel alloy or austenitic stainless steel is preferably used since it has excellent strength and plays a role as a reinforcing material.

In general, austenitic stainless steel is in a non-magnetic state at room temperature; that is, it is in a state in which the metal texture is 100% in the austenite ($\gamma$) phase. When an ($\alpha'$) phase transformation point (Ms point) of a martensite, which is ferromagnetic, is at 77 K or higher, in contrast, an $\alpha'$ phase, which is ferromagnetic at a liquid nitrogen temperature, may appear. Accordingly, an austenitic stainless steel plate with an Ms point designed at 77 K or below is preferably used as a substrate for a superconducting wire to be used at a temperature below a liquid nitrogen temperature (77 K).

As a $\gamma$-stainless steel plate, a plate material, such as SUS316, SUS316L, SUS310, or SUS305, is preferably used because such material has a stable $\gamma$ phase with an Ms point designed to be sufficiently lower than 77 K, and it is widely available at a relatively low cost. A metal plate having a thickness of 20 $\mu$m or more is generally applicable herein. From the viewpoint of the reduced thickness and strength of a superconducting wire, a thickness of a metal plate is preferably 50 $\mu$m to 100 $\mu$m, although the thickness is not limited to such range.

In the present invention, the term "high-reduction rolled metal layer" refers to a metal layer having the features described below. That is, it was cold-rolled preferably at reduction of 90% or higher and more preferably at high reduction of 95% or higher at the time of final rolling, it was not subjected to thermal treatment for recrystallization after cold-rolling, and it retains rolled texture developed as a result of cold rolling. When reduction is less than 90%, metal may not be oriented in the later process of thermal treatment.

The high-reduction rolled metal layer used for the substrate of the present invention can be made of a metal that is crystal-oriented by rolling, followed by thermal treatment. For example, such metal can be at least one member selected from the group consisting of nickel, copper, silver, and aluminum or an alloy thereof. Because of ease of achieving a higher degree of biaxial crystal orientation and satisfactory lattice matching with the intermediate layer, the high-reduction rolled metal layer is preferably made of copper or a copper alloy.

A high-reduction rolled metal layer may contain a very small amount (about 1% or less) of an element in order to further improve biaxial crystal orientation by the thermal treatment described below. Examples of such an additional element include one or more types of elements selected from among Ag, Sn, Zn, Zr, O, and N. These additional elements and metals contained in the high-reduction rolled metal layer form a solid solution. If the amount thereof to be added exceeds 1%, impurities such as oxides other than a solid solution increase. This may adversely affect the crystal orientation.

A metal foil can be preferably used as a high-reduction rolled metal layer. Such metal foil can be generally obtained. Examples thereof include a high-reduction rolled copper foil (HA foil (trade name)) manufactured by JX Nippon Mining & Metals Corp, and a high-reduction rolled copper foil (HX foil (trade name)) manufactured by Hitachi Cable, Ltd.

In general, it is preferable that a thickness of a high-reduction rolled metal layer be from 7 $\mu$m to 70 $\mu$m, so as to maintain the strength of the high-reduction rolled metal layer and improve the processability at the time of later processing of a superconducting wire.

In order to regulate a percentage of an area in which the crystal orientation of metals of the outermost layer of the substrate is deviated by 6 degrees or more from the (001) [100] per unit area to 6 degrees or less, the substrate for a superconducting wire according to the present invention can involve the use of a high-reduction rolled metal layer, such as a copper foil, with a degree of gloss of, for example, 45 or less, preferably from 20 to 45, and more preferably from 20 to 43. In the present invention, the "degree of gloss" is the L value determined by measuring the L*, a*, and b*, using a colorimeter, of the high-reduction rolled metal layer before it is superposed on the non-magnetic metal plate and after it is rolled in the method of producing the substrate described below.

The substrate for a superconducting wire according to the present invention may comprise a protective layer formed on a crystal-oriented metal layer.

A protective layer used for the substrate for a superconducting wire according to the present invention is preferably made of a metal having a face-centered cubic lattice structure, such as nickel, palladium, silver, or an alloy thereof, with nickel or a nickel alloy being more preferable, for the following reasons. That is, a nickel-containing protective layer has excellent acid resistance. In the presence of a protective layer, distortion of crystal orientation, which may occur upon formation of an oxide layer of metals contained in the crystal-oriented metal layer at the time of formation of an intermediate layer made of $CeO_2$ or the like on the protective layer, can be prevented. As an element to be contained in a nickel, palladium, or silver alloy, an element that leads to decreased magnetism is preferable, and examples thereof include Cu, Sn, W, and Cr. In addition, impurities may be contained, as long as they do not adversely affect the crystal orientation.

When a protective layer is too thin, metals in the crystal-oriented metal layer may diffuse onto the surface of the protective layer and oxidize the surface at the time when an intermediate layer and a superconducting layer are superposed on the protective layer during the production of the superconducting wire. When a protective layer is too thick, in contrast, the protective layer becomes deteriorated in crystal orientation, and the plating distortion increases. The thickness of a protective layer is appropriately determined in view of these possibilities. Specifically, a thickness is preferably from 1 $\mu$m to 5 $\mu$m.

2. Method for Manufacturing Substrate for Superconducting Wire

The substrate for a superconducting wire according to the present invention can be manufactured by a method comprising a step of forming a layer with a c-axis orientation rate of 99% or higher, a Δφ of 6 degrees or less, and a percentage of an area in which the crystal orientation is deviated by 6 degrees or more from the (001) [100] per unit area of 6% or less via thermal treatment.

According to an embodiment of the present invention, a layer with a c-axis orientation rate of 99% or higher, a Δφ of 6 degrees or less, and a percentage of an area in which the crystal orientation is deviated by 6 degrees or more from the (001) [100] per unit area of 6% or less formed via thermal treatment is a crystal-oriented metal layer.

Thermal treatment is performed at, for example, 150° C. or higher. While the duration of thermal treatment varies depending on temperature, for example, thermal treatment may be performed for 1 to 10 hours at 400° C., and for several seconds to about 5 minutes at a high temperature of 700° C. or higher. If the temperature for thermal treatment is too high, a high-reduction rolled metal layer is more likely to undergo secondary recrystallization, and the crystal orientation deteriorates. Accordingly, thermal treatment is performed at 150° C. to 1000° C., if a substrate is exposed to an excessively high temperature of 600° C. to 900° C. in the later step of forming an intermediate layer or superconducting layer, thermal treatment is preferably carried out at 600° C. to 900° C. More preferably, thermal treatment is performed in a stepwise manner, such that thermal treatment is first performed at a low temperature and then at a high temperature. Thus, the degree of crystal orientation and surface roughness of the crystal-oriented metal layer and the protective layer that would be formed later can be improved. It is particularly preferable that thermal treatment be first performed at 200° C. to 400° C. and then at 800° C. to 900° C.

According to an embodiment of the present invention, a substrate for a superconducting wire is manufactured by a method comprising steps of: laminating a non-magnetic metal plate and a high-reduction rolled metal layer through surface activation bonding; and subjecting a high-reduction rolled metal layer to thermal treatment, so as to adjust the c-axis orientation rate to 99% or higher, the Δφ value to 6 degrees or less, and the percentage of the area in which the crystal orientation is deviated by 6 degrees or more from the (001) [100] per unit area to 6% or less.

In the method for manufacturing the substrate for a superconducting wire according to the present invention, a percentage of an area in which the crystal orientation is deviated by 6 degrees or more from the (001) [100] on the outermost layer of the resulting substrate for a superconducting wire per unit area is regulated to be 6% or less by, for example, adjusting the degree of gloss of a high-reduction rolled metal layer, such as a copper foil. The degree of gloss of a high-reduction rolled metal layer is, for example, 45 or less, preferably from 20 to 45, and more preferably from 20 to 43. In the present invention, the "degree of gloss" is the L value determined by measuring, using a colorimeter, L*, a*, and b* of the high-reduction rolled metal layer before it is superposed on the non-magnetic metal plate and after it is rolled. In addition to the method of adjusting the degree of gloss of the high-reduction rolled metal layer, for example, the copper orientation in the rolled texture of the high-reduction rolled metal layer may be increased, and the brass orientation therein may be decreased. Thus, the percentage of the area in which the crystal orientation is deviated by 6 degrees or more from the (001) [100] per unit area can be adjusted to 6% or less on the outermost layer of the thermally treated substrate, although the method is not limited thereto.

In the step of laminating a non-magnetic metal plate and a high-reduction rolled metal layer through surface activation bonding in the method for manufacturing the substrate for a superconducting wire according to the present invention, the surface of the non-magnetic metal plate and that of the high-reduction rolled metal layer are subjected to sputter etching treatment, respectively, so as to remove the surface adsorption layer and the surface oxide film for surface activation, and the activated two surfaces are then bonded to each other by cold rolling.

In surface activation bonding, specifically, a non-magnetic metal plate and a high-reduction rolled metal layer are prepared as elongated coils having a width of 150 mm to 600 mm, and the two surfaces to be bonded are first activated, followed by cold rolling.

The surface activation treatment is carried out by performing sputter etching treatment wherein the non-magnetic metal plate and the high-reduction rolled metal layer having surfaces to be bonded are designated as electrodes at one side, which are connected to a ground, respectively, a glow discharge is generated by applying an AC current of 1 to 50 MHz to a region between such electrodes and the other electrodes, which are supported in an insulated manner, and an area of the electrode that is exposed to the plasma generated by the glow discharge is ⅓ or less of the area of the other electrode. As an inert gas, argon, neon, xenon, krypton or a gas mixture containing at least one kind of gas selected from among such gases is applicable.

In the sputter etching treatment, surfaces to be bonded of the non-magnetic metal plate and the high-reduction rolled metal layer are subjected to sputtering by an inert gas, so that at least surface adsorption layers are removed. In addition, surface oxide films may be removed. The surfaces to be bonded are activated by this treatment. During this sputter etching treatment, the electrodes connected to the ground are in the form of cooling rolls. Thus, the elevation of temperature of the respective materials to be conveyed is prevented.

Thereafter, the non-magnetic metal plate and the high-reduction rolled metal layer are continuously conveyed to a pressure bonding roll step, so that the activated surfaces are pressure-bonded to each other. When an $O_2$ gas or the like exists in the pressure bonding atmosphere, the activated surfaces are oxidized again during the conveyance, and the adhesion therebetween is adversely affected. A laminate, which is formed by bonding the non-magnetic metal plate and the high-reduction rolled metal layer to each other in close contact through the above-mentioned pressure bonding step, is conveyed to a winding step, and it is wound in this step.

In the above-mentioned sputter etching step, materials adsorbed onto the surfaces to be bonded are completely removed; however, it is not necessary to completely remove a surface oxidized layer for the following reasons. That is, even if the oxidized layer remains on the entire surface, the bonding property between the non-magnetic metal plate and the high-reduction rolled metal layer can be maintained by increasing the reduction rate in the bonding step and exposing the base by making use of friction on the surfaces to be bonded.

If an oxidized layer is to be completely removed by dry etching, a high plasma output or etching for a long period of time becomes necessary, and the temperature of a material is elevated disadvantageously. When the temperature of the high-reduction rolled metal layer is elevated to a level equivalent to or higher than the recrystallization initiation temperature of metals in the high-reduction rolled metal layer, the high-reduction rolled metal layer undergoes recrystallization during sputter etching treatment. As a result, the crystal orientation of the high-reduction rolled metal layer is determined prior to bonding. When the high-reduction rolled metal layer on which crystals are oriented is rolled, distortion is introduced into the high-reduction rolled metal layer, and the biaxial crystal orientation of the high-reduction rolled metal layer deteriorates. In the sputter etching step, accordingly, it is necessary to maintain the temperature of the high-reduction rolled metal layer at a temperature below the metal recrystallization initiation point. When a copper foil is used as a high-reduction rolled metal layer, for example, the temperature of the copper foil is maintained below 150° C. The temperature of the copper foil is preferably maintained at 100° C. or below, so as to maintain the metal texture of the high-reduction rolled metal layer in the form of the rolled texture.

In the treatment whereby sputter etching is applied to the non-magnetic metal plate, also, treatment with a high plasma output or the elevation of temperature of the metal plate to the metal recrystallization initiation point or higher via treatment for a long period of time may lead to the elevated temperature of the high-reduction rolled metal layer due to the contact between the metal plate and the high-reduction rolled metal layer at the time of rolling. The recrystallization of the high-reduction rolled metal layer may also take place simultaneously with the rolling, and the biaxial crystal orientation may deteriorate.

In the sputter etching step of the non-magnetic metal plate, accordingly, the temperature of the metal plate is preferably maintained below the recrystallization initiation point of metals in the high-reduction rolled metal layer. When a copper foil is used as a high-reduction rolled metal layer, for example, the temperature of the copper foil is maintained below 150° C. The temperature of the high-reduction rolled metal layer is preferably maintained within a range of room temperature to 100° C.

After the surface of the non-magnetic metal plate and that of the high-reduction rolled metal layer are activated in the manner described above, they are bonded to each other using pressure rolls in the vacuum. In such cases, a higher degree of vacuum is preferable from the viewpoint of the prevention of re-adsorption to the surface, although a degree of vacuum of $10^{-5}$ Pa to $10^{-2}$ Pa is sufficient.

In addition, the bonding strength between the non-magnetic metal plate and the high-reduction rolled metal layer is lowered due to oxygen re-adsorption to the surface of the non-magnetic metal plate and to that of the high-reduction rolled metal layer. Accordingly, it is also preferable to perform the bonding using pressure rolls in a non-oxidizing atmosphere, such as in an inert gas atmosphere such as that of an Ar gas.

Pressure application using pressure rolls is performed to ensure a bonded area of a bonding boundary between the non-magnetic metal plate and the high-reduction rolled metal layer as well as to expose a base by peeling a partial surface oxidized film layer by making use of friction that occurs in the bonding boundary at the time of rolling reduction. It is preferable to apply a pressure of 300 MPa or more. Both the non-magnetic metal plate and the high-reduction rolled metal layer are particularly hard materials. Accordingly, it is preferable to apply a pressure of 600 MPa to 1.5 GPa. A pressure exceeding 1.5 GPa may be applied, and it is confirmed that the crystal orientation does not deteriorate after thermal treatment at reduction of up to 30%. It is preferable that pressure be applied to adjust the reduction to below 5%. With the application of pressure that results in reduction exceeding 30%, cracks occur on the surface of the high-reduction rolled metal layer, and the crystal orientation of the crystal-oriented metal layer deteriorates after rolling and thermal treatment.

The high-reduction rolled metal layer of the laminate of the non-magnetic metal plate and the high-reduction rolled metal layer prepared by surface activation bonding described above are thermally treated, so as to adjust a c-axis orientation rate to 99% or higher, a $\Delta\varphi$ to 6 degrees or less, and a percentage of an area in which the crystal orientation is deviated by 6 degrees or more from the (001) [100] per unit area to 6% or less. As described above, thermal treatment is performed at, for example, 150° C. or higher. While the duration of thermal treatment varies depending on temperature, for example, thermal treatment may be performed for 1 to 10 hours at 400° C., and for several seconds to about 5 minutes at a high temperature of 700° C. or higher. If the temperature for thermal treatment is too high, a high-reduction rolled metal layer is more likely to undergo secondary recrystallization, and crystal orientation deteriorates. Accordingly, thermal treatment is performed at 150° C. to 1000° C. If a substrate is exposed to a high temperature of 600° C. to 900° C. during the later step of forming an intermediate layer or superconducting layer, thermal treatment is preferably carried out at 600° C. to 900° C. More preferably, thermal treatment is performed in a stepwise manner, such that thermal treatment is first performed at a low temperature and then at a high temperature. Thus, the degree of crystal orientation and surface roughness of the crystal-oriented metal layer and the protective layer that would be formed later can be improved. It is particularly preferable that thermal treatment be first performed at 200° C. to 400° C. and then at 800° C. to 900° C.

As described above, the substrate for a superconducting wire according to the present invention can comprise a protective layer formed on a crystal-oriented metal layer. The laminate of the biaxially crystal-oriented metal layer resulting from thermal treatment of the high-reduction rolled metal layer and the non-magnetic metal plate may be plated, so that a protective layer maintaining the crystal orientation of the crystal-oriented metal layer can be formed on the crystal-oriented metal layer.

Plating can be performed under appropriate conditions that would minimize the plating distortion of a protective layer. The term "plating distortion" used herein refers to the degree of distortion that takes place within a plated film when a base such as a metal plate is plated. When a layer made of nickel is formed as a protective layer, for example, plating may be performed with the use of a Watts bath or a sulfamate bath, which has been known as a plating bath. Use of a sulfamate bath is particularly preferable because the plating distortion of the protective layer can be easily reduced. While the preferable composition of a plating bath is as described below, the composition is not limited thereto.

(Watts Bath)
Nickel sulfate: 200-300 g/l
Nickel chloride: 30-60 g/l
Boric add 30-40 g/l
pH: 4.5
Bath temperature: 40° C.-60° C.
(Sulfamate Bath)
Nickel sulfamate: 200-600 g/l
Nickel chloride: 0-15 g/l
Boric acid: 30-40 g/l
Additive: Appropriate quantity
pH: 3.5-4.5
Bath temperature: 40° C.-70° C.

Current density when plating is performed is not particularly limited and it is appropriately determined in view of a balance thereof with the time required for plating. When a plated film of 2 μm or more is formed as a protective layer, for example, low current density may result in a longer period of time required for plating, a decreased line speed to secure the time therefor, lower productivity, and difficulty in plating control. In general, accordingly, current density is preferably 10 A/dm$^2$ or more. Also, the upper limit of current density differs depending on the type of plating bath, and it is not particularly limited. For example, current density is preferably 25 A/dm$^2$ or less in the case of a Watts bath, and it is preferably 35 A/dm$^2$ or less in the case of a sulfamate bath. When current density exceeds 35 A/dm$^2$, in general, a good crystal orientation may not be obtained due to so-called "plating burning."

The thus formed protective layer may undergo the formation of micropits on the surface depending on plating conditions and the like. In such a case, the surface can be smoothed by leveling via further thermal treatment after plating, if necessary. In such a case, thermal treatment temperature is preferably, for example, from 700° C. to 1000° C.

In order to satisfactorily maintain the crystal orientation of an intermediate layer and a superconducting compound layer to be further superposed by epitaxial growth onto a protective layer, according to need, a non-magnetic metal plate and a high-reduction rolled metal layer may be bonded to each other, and treatment aimed at reduction of surface roughness Ra of the high-reduction rolled metal layer may then be performed. Specifically, methods such as rolling reduction using pressure rolls, buffing, electropolishing, and electrolytic abrasive grain polishing can be employed. It is preferable that surface roughness Ra be adjusted to, for example, 20 nm or less, and preferably 10 nm or less, by such methods.

3. Superconducting Wire

An intermediate layer and a superconducting layer may be superposed in that order on the substrate for a superconducting wire as described above in accordance with a conventional technique, so that a superconducting wire can be manufactured. Specifically, an intermediate layer of $CeO_2$, YSZ, $SrTiO_3$, MgO, $Y_2O_3$, or the like may be epitaxially deposited using a means such as a sputtering method on the outermost layer of the substrate for a superconducting wire, and a Y123-based superconducting compound layer or the like may be further deposited thereon by, for example, the pulsed laser deposition (PLD) method, the metal organic deposition (MOD) method, or the metal organic chemical vapor deposition (MOCVD) method. Thus, a superconducting wire can be obtained. A plurality of intermediate layers may be formed. If necessary, a protective film made of Ag, Cu, or the like may further be provided on the superconducting compound layer.

EXAMPLES

Hereafter, the present invention is described in greater detail with reference to the examples and the comparative examples, although the technical scope of the present invention is not limited to these examples.

Example 1

SUS316L (thickness: 100 μm) was used as a non-magnetic metal plate, and a copper foil (thickness: 18 μm) exhibiting a degree of gloss of 42.8 measured with a colorimeter (NR-3000, Nippon Denshoku Industries, Co., Ltd.) after it had been rolled at reduction of 96% to 99% was used as a high-reduction rolled metal layer. SUS316L and the copper foil were bonded to each other via surface activation at room temperature using a surface activation bonding apparatus. Thus, a laminate of SUS316L and the copper foil was formed.

When conducting surface activation bonding, sputter etching was applied to the bonded surfaces at 0.1 Pa with a plasma output of 200 W for 20 seconds. Thus, layers of materials adsorbed onto the surface of SUS316L and that of the copper foil were completely removed. A pressure of 600 MPa was applied with the use of pressure rolls.

The copper layer surface of the laminate was polished to have a surface roughness Ra of 20 nm or less, and the laminate was then subjected to thermal treatment at 250° C. for an annealing time of 5 minutes. Thereafter, the laminate was subjected to thermal treatment using a continuous thermal treatment furnace at 850° C. for an annealing time of 5 minutes. Thus, crystals of the copper foil were biaxially oriented. The thermally treated copper foil surface was analyzed with the use of EBSD described below. As a result, the percentage of the area in which the crystal orientation is deviated by 6 degrees or more from the (001) [100] was found to be 4.9%.

Subsequently, nickel was plated onto the copper layer using the laminate as a cathode. Thus, a substrate comprising a nickel layer as a protective layer was obtained. The composition of the plating bath is as follows. In addition, the nickel plating thickness was set to 2.5 μm, the plating bath temperature was set at 60° C., and the pH level of the plating bath was set at 4.
(Sulfamate Bath)
Nickel sulfamate: 450 g/l
Nickel chloride: 5 g/l
Boric acid: 30 g/l
Additive: 5 ml/l Example 2

The procedure of Example 1 was performed, except that a copper foil (thickness: 18 μm) rolled at reduction of 96% to 99% and exhibiting a degree of gloss of 43.2 was used as the high-reduction rolled metal layer. On the thermally treated copper foil surface prior to the formation of a protective layer, the percentage of the area in which the crystal orientation is deviated by 6 degrees or more from the (001) [100] was 3.9%.

Comparative Example 1

The procedure of Example 1 was performed, except that a copper foil (thickness: 18 μm) rolled at reduction of 96% to 99% and exhibiting a degree of gloss of 55.4 was used as the high-reduction rolled metal layer. On the thermally treated copper foil surface prior to the formation of a protective layer, the percentage of the area in which the crystal orientation is deviated by 6 degrees or more from the (001) [100] was 10.9%.

The crystal orientation and the crystal orientation of the outermost layers of the substrates obtained in Examples 1 and 2 and Comparative Example 1 were determined.
(1) Area in which Crystal Orientation is Deviated by 6 Degrees or More from that of (001) [100]

The obtained substrate was analyzed with the use of EBSD (SEM-840, JEOL Ltd. and DigiView, TSL Solutions) and using crystal orientation analysis software (OIM Data Collection and OIM Analysis, EDAX), and the percentage of the area in which the crystal orientation is deviated by 6 degrees or more from the (001) [100] per 1 mm² was determined. Specifically, the reference plane was designated as (001) [100] for "crystal orientation," ranges of inclination therefrom were determined, and proportion figures for relevant areas in each range of inclination was determined.

Figure 2:
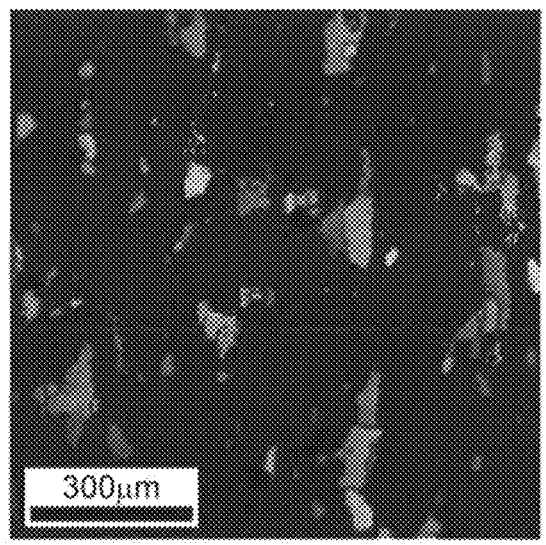
FIG. 2 shows the results of EBSD analysis for the substrate of Comparative Example 1.

FIG. 1 shows the results of analysis of the substrate according to Example 2, and FIG. 2 shows the results of analysis of the substrate according to Comparative Example 1. In FIGS. 1 and 2, a dark gray or gray region indicates crystals in which the crystal orientation is deviated by 6 degrees or more from the (001) [100]. On the substrate of Example 2 shown in FIG. 1, the percentage of the area in which the crystal orientation is deviated by 6 degrees or more from the (001) [100] is apparently smaller than that of the substrate of Comparative Example 1, as shown in FIG. 2.

(2) In-Plane Orientation Degree ($\Delta\varphi$)

The obtained substrate was analyzed with the use of EBSD and with reference to the "crystal direction" <111>// ND using crystal orientation analysis software in the manner described below, so as to determine the in-plane orientation degree ($\Delta\varphi$).

1. In the crystal coordinate system, the axis <111> is rotated to be aligned with the ND [001] of the sample coordinate system.
2. Thereafter, the degree of inclination of the <111> axis of the crystal coordinate system at each measurement point relative to the ND [001] axis of the sample coordinate system is determined.
3. An inclination at each point is demonstrated on a cumulative graph. An inclination when the number fraction is 0.5 is shown on the vertical axis, and the alignment is designated to be a half that of $\Delta\varphi$. Accordingly, a value twice as large as the determined value is designated as the $\Delta\varphi$ value.

(3) C-Axis Orientation Rate

The obtained substrate was subjected to $\theta/2\theta$ analysis using an X-ray diffractometer (RINT 2000, Rigaku Corporation), and the c-axis orientation of the (200) plane was determined. Specifically, such value was determined in accordance with the following equation: c-axis orientation rate (%)=I (200)/$\Sigma$I (hkl)×100(%).

The results are shown in Table 1.

more from the (001) [100]. Specifically, a smaller $\Delta\varphi$ value does not merely indicate a smaller area in which the crystal orientation is deviated by 6 degrees or more from the (001) [100], and a $\Delta\varphi$ value and a percentage of an area in which the crystal orientation is deviated (%) are different factors.

Example 3 and Comparative Example 2

On the substrates obtained in Example 1 and Comparative Example 1, intermediate layers ($CeO_2$, YSZ, $Y_2O_3$) were formed thereon via RF magnetron sputtering, and superconducting layers (YBCO) with a thickness of 0.15 μm were formed thereon via metal organic deposition (MOD), so as to obtain superconducting wire. The superconducting wire obtained with the use of the substrate of Example 1 was designated as the superconducting wire of Example 3, and that obtained with the use of the substrate of Comparative Example 1 was designated as the superconducting wire of Comparative Example 2. The critical current (Ic) of the superconducting wire of Example 3 and that of Comparative Example 2 were measured over a superconducting wire width of 10 mm. The critical current (Ic) was measured at a temperature of 77 K in the self-magnetic field, and the result of measurement was determined to be the current value applied when an electric field of $10^{-6}$ V/cm was generated. The results are shown in Table 2.

TABLE 2

| | Ic (A/cm) |
|---|---|
| Ex. 3 | 30 |
| Comp. Ex. 2 | 20 |

In comparison with the superconducting wire of Comparative Example 2 manufactured with the use of the substrate comprising the outermost layer with a large area (i.e., 13.8%) in which the crystal orientation is deviated by 6 degrees or more from the (001) [100], improvement in superconductivity was observed in the superconducting wire of Example 3 manufactured with the use of the substrate comprising the outermost layer with a small area (i.e., 5.2%) in which the crystal orientation is deviated by 6 degrees or more from the (001) [100].

TABLE 1

| | Area deviated from (001) [100] (%) | | | | | Area deviated by 6° or more from (001) [100] (%) | c-axis orientation rate | $\Delta\varphi$ (°) |
|---|---|---|---|---|---|---|---|---|
| | 6°-8° | 8°-10° | 10°-12° | 12°-15° | 15° or more | | | |
| Ex. 1 | 4.8 | 0.4 | 0 | 0 | 0 | 5.2 | 99% or higher | 4.98 |
| Ex. 2 | 3.3 | 1.7 | 0.3 | 0.2 | 0.1 | 5.7 | 99% or higher | 5.22 |
| Comp. Ex. 1 | 10.9 | 2.3 | 0.5 | 0.1 | 0 | 13.8 | 99% or higher | 5.58 |

The difference between the substrates of Examples 1 and 2 and the substrate of Comparative Example 1 is not significant in terms of $\Delta\varphi$ (i.e., a difference of about 0.3 to 0.6 degrees). In contrast, the difference in terms of the area in which the crystal orientation is deviated by 6 degrees or more from the (001) [100] on the outermost layer of the substrate is significant (i.e., 8% or more). This indicates that there is no direct correlation, such as a proportional correlation, between the $\Delta\varphi$ value and the percentage of the area in which the crystal orientation is deviated by 6 degrees or Example 4 and Comparative Example 3

Figure 3:
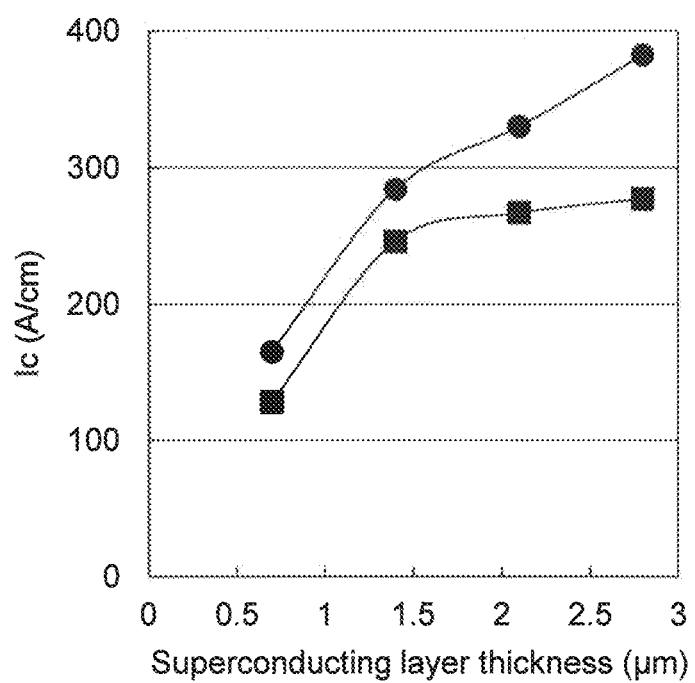
FIG. 3 shows superconductivity of the superconducting wire of Example 4 and that of Comparative Example 3.

Intermediate layers ($CeO_2$, YSZ, $CeO_2$) were formed on the substrates obtained in Example 2 and Comparative Example 1 via RF magnetron sputtering, and superconducting layers (GdBCO) with a thickness of 0.7 μm, 1.4 μm, 2.1 μm, and 2.8 μm were formed on such substrates via pulse laser deposition (PLD), so as to obtain superconducting wires. The superconducting wires obtained with the use of the substrate of Example 1 were designated as the superconducting wires of Examples 4-1 to 4-4, and those obtained with the use of the substrate of Comparative Example 1 were designated as the superconducting wires of Comparative Examples 3-1 to 3-4. Table 3 and FIG. 3 show the results of measurement of critical currents (Ic) of the superconducting wires of Examples 4-1 to 4-4 and those of Comparative Examples 3-1 to 3-4 over a superconducting wire width of 10 mm. In FIG. 3, symbols "○" each represent the critical currents (Ic) of the superconducting wires of Examples 4-1 to 4-4, and symbols "□" each represent the critical currents (Ic) of the superconducting wires of Comparative Examples 3-4 to 3-4.

TABLE 3

|  | Ic (A/cm) | Superconducting layer thickness (μm) |
|---|---|---|
| Ex. 4-1 | 165 | 0.7 |
| Ex. 4-2 | 284 | 1.4 |
| Ex. 4-3 | 330 | 2.1 |
| Ex. 4-4 | 382 | 2.8 |
| Comp. Ex. 3-1 | 128 | 0.7 |
| Comp. Ex. 3-2 | 246 | 1.4 |
| Comp. Ex. 3-3 | 267 | 2.1 |
| Comp. Ex. 3-4 | 277 | 2.8 |

Table 3 and FIG. 3 demonstrate that superconductivity of the superconducting wires of Examples 4-1 to 4-4 and those of Comparative Examples 3-1 to 3-4 increases as the thickness of the superconducting layer increases. In comparison with the superconducting wires of Comparative Examples 3-1 to 3-4 manufactured with the use of a substrate comprising an outermost layer with a large area (i.e., 13.8%) in which the crystal orientation is deviated by 6 degrees or more from the (001) [100], improvement in superconductivity was observed in the superconducting wires of Examples 4-1 to 4-4 manufactured with the use of a substrate comprising an outermost layer with a small area (i.e., 5.7%) in which the crystal orientation is deviated by 6 degrees or more from the (001) [100], regardless of the layer thickness. This indicates that the critical current density thereof is high.

Reference Example

Copper foils exhibiting various degrees of gloss, which had been rolled at reductions of 96% to 99%, were thermally treated in a box-shaped thermal treatment furnace at 850° C. for 5 minutes, and the crystals of the copper foils were biaxially oriented. The in-plane orientation degrees (Δφ) and the percentage of the area in which the crystal orientation is deviated by 6 degrees or more from the (001) [100]s of the copper foils were determined with the use of EBSD. The results are shown in Table 4.

TABLE 4

| Degree of gloss | Area deviated by 6° or more from (001) [100] (%) | Δφ (°) | c-axis orientation rate (%) |
|---|---|---|---|
| 34.3 | 3.06 | 4.59 | 99% or higher |
| 36.4 | 4.47 | 5.07 | 99% or higher |
| 38.9 | 3.80 | 4.77 | 99% or higher |
| 39.4 | 2.90 | 4.82 | 99% or higher |
| 42.8 | 5.27 | 4.56 | 99% or higher |
| 43.2 | 4.03 | 4.60 | 99% or higher |
| 46.2 | 6.06 | 4.99 | 99% or higher |

TABLE 4-continued

| Degree of gloss | Area deviated by 6° or more from (001) [100] (%) | Δφ (°) | c-axis orientation rate (%) |
|---|---|---|---|
| 55.1 | 8.57 | 4.95 | 99% or higher |
| 55.4 | 10.90 | 5.61 | 99% or higher |

Table 4 demonstrates that the use of a copper foil with a degree of gloss of 45 or less enables the regulation of the percentage of the area in which the crystal orientation is deviated by 6 degrees or more from the (001) [100] of the copper foil to 6% or less. In addition, Table 4 demonstrates that there is no direct correlation, such as a proportional correlation, between a Δφ value and a percentage of an area in which the crystal orientation is deviated by 6 degrees or more from the (001) [100]. In particular, it was observed that percentage of the area in which the crystal orientation is deviated by 6 degrees or more would increase even if the Δφ value were to decrease.

All publications, patents, and patent applications cited herein are incorporated herein by reference in their entirety.

The invention claimed is:

1. A substrate for a superconducting wire, comprising a non-magnetic metal plate, a layer of copper or a copper alloy superposed on the non-magnetic metal plate, and an outermost protective layer consisting of a plated film of nickel or a nickel alloy formed on the layer of copper or the copper alloy, wherein the crystal orientation of the outermost protective layer exhibits
   a c-axis orientation rate of 99% or higher,
   a Δφ of 6 degrees or less, and
   a percentage of an area in which the crystal orientation is deviated by 6 degrees or more from the (001) [100] per unit area of 6% or less, wherein the crystal orientation deviation is observed via the electron back scatter diffraction (EBSD) method.

2. A superconducting wire comprising the substrate for a superconducting wire according to claim 1, an intermediate layer superposed thereon, and a superconducting layer superposed thereon.

3. The substrate for a superconducting wire according to claim 1, wherein the substrate comprises the non-magnetic metal plate, the layer of copper containing 1% or less of an additional element superposed on the non-magnetic metal plate, and the outermost protective layer consisting of a plated film of nickel or a nickel alloy formed on the layer of copper.

4. A method for manufacturing a substrate for a superconducting wire according to claim 1 comprising:
   laminating a non-magnetic metal plate and a copper or copper alloy foil through surface activation bonding to form a layer of copper or the copper alloy;
   subjecting the layer of copper or the copper alloy to thermal treatment, so as to achieve
   a c-axis orientation rate of 99% or higher,
   a Δφ of 6 degrees or less, and
   a percentage of an area in which the crystal orientation is deviated by 6 degrees or more from the (001) [100] per unit area of 6% or less, wherein the crystal orientation deviation is observed via the electron back scatter diffraction (EBSD) method; and
   forming an outermost protective layer consisting of a plated film of nickel or a nickel alloy on the layer of copper or the copper alloy, wherein the outermost protective layer maintains the crystal orientation of the layer of copper or the copper alloy.

5. The method according to claim 4, wherein the degree of gloss of the copper or copper alloy foil is 45 or less before lamination.

\* \* \* \* \*